(12) United States Patent
Leffel

(10) Patent No.: US 10,659,177 B1
(45) Date of Patent: May 19, 2020

(54) METHOD OF DETERMINING A RELATIVE PHASE CHANGE OF A LOCAL OSCILLATOR SIGNAL AND METHOD OF DETERMINING A RELATIVE PHASE CHANGE OF A RADIO FREQUENCY SIGNAL

(71) Applicant: Rohde & Schwarz GmbH & Co. KG, Munich (DE)

(72) Inventor: Mike Leffel, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/512,848

(22) Filed: Jul. 16, 2019

(51) Int. Cl.
| | |
|---|---|
| *G01R 27/28* | (2006.01) |
| *H04B 17/12* | (2015.01) |
| *H01Q 3/26* | (2006.01) |
| *H04B 17/10* | (2015.01) |

(52) U.S. Cl.
CPC .............. *H04B 17/12* (2015.01); *G01R 27/28* (2013.01); *H01Q 3/267* (2013.01); *H04B 17/101* (2015.01)

(58) Field of Classification Search
CPC ........ H04B 17/00; G01R 27/28; G01R 35/00; G01R 35/005
See application file for complete search history.

(56) References Cited

U.S. PATENT DOCUMENTS

| | | | | |
|---|---|---|---|---|
| 5,914,441 | A | * | 6/1999 | Hunter ...................... C22B 3/18 266/101 |
| 6,448,786 | B1 | * | 9/2002 | Dunsmore ............. G01R 27/28 324/601 |
| 6,690,722 | B1 | * | 2/2004 | Dunsmore ............... H04B 3/46 324/601 |
| 7,561,987 | B2 | | 7/2009 | Nakayama et al. |
| 7,868,607 | B2 | * | 1/2011 | Dunsmore ............. G01R 27/32 324/617 |
| 2008/0258707 | A1 | * | 10/2008 | Dunsmore ............. G01R 27/32 324/76.23 |
| 2014/0306719 | A1 | * | 10/2014 | Dunsmore ........... G01R 35/005 324/601 |
| 2015/0177300 | A1 | | 6/2015 | Paech et al. |
| 2018/0080965 | A1 | * | 3/2018 | Stein .................... G01R 23/175 |
| 2019/0072594 | A1 | * | 3/2019 | Leibfritz ................ G01R 27/28 |
| 2019/0072598 | A1 | | 3/2019 | Leibfritz et al. |

* cited by examiner

*Primary Examiner* — Blane J Jackson
(74) *Attorney, Agent, or Firm* — Christensen O'Connor Johnson Kindness PLLC

(57) ABSTRACT

A method is provided that determines a relative phase change of a local oscillator signal. A method of determining a relative phase change of a RF signal is also provided. Generally, the methods described ensure that the effect of a swept local oscillator frequency on the measurements can be identified, particularly quantified. Hence, the effect can be considered in the error correction model applied later such that the measurement equipment can be calibrated appropriately.

18 Claims, 3 Drawing Sheets

METHOD OF DETERMINING A RELATIVE PHASE CHANGE OF A LOCAL OSCILLATOR SIGNAL AND METHOD OF DETERMINING A RELATIVE PHASE CHANGE OF A RADIO FREQUENCY SIGNAL

FIELD OF THE DISCLOSURE

Embodiments of the present disclosure relate to a method of determining a relative phase change of a local oscillator signal. Further, embodiments of the present disclosure relate to a method of determining a relative phase change of a radio frequency signal.

BACKGROUND

In modern communication systems such as wireless and satellite communication systems, frequency-converting devices are used that have to be characterized with regard to their electrical behavior. Typically, this is done by frequency-converting measurements applied on the frequency-converting devices, particularly mixers. Hence, the frequency-converting devices to be characterized are also called devices under test or rather frequency-converting devices under test during the respective frequency-converting measurements.

However, the challenge with frequency-converting measurements is twofold. Two input signals are forwarded or rather inputted into the respective device under test, namely a radio frequency input signal (RF signal) and a local oscillator input signal (LO signal). The output of the device under test is assigned to an intermediate frequency output signal (IF signal). The IF signal outputted has a resulting phase that is a combination of the phase of the RF signal, the phase of the LO signal, and the insertion phase of the respective device under test.

Further, measurement equipment used for the respective measurements, for instance a measurement device such as a network analyzer, may measure the scattering parameters of the frequency-converting device under test. The measurement equipment has two receivers utilized to measure the input signal, particularly the RF signal, and the output signal of the device under test. Accordingly, the phase of the RF signal at the input to the device under test as well as the phase of the IF signal at the output of the device under test are measured by the measurement equipment respectively, particularly by the internal receivers of the measurement device, namely the network analyzer.

These internal receivers each have their own insertion phase being a function of frequency.

Accordingly, the phases of the internal receivers also have a contribution to the measurements in addition to the phase of the RF signal, the phase of the LO signal and the insertion phase of the device under test. In other words, the phases of the internal receivers, the phase of the RF signal, the phase of the LO signal and the insertion phase of the device under test are all involved in the measurements.

The goal of the characterization is to measure the insertion phase of the device under test. Thus, there is a need to identify and remove the impact of the other factors mentioned above. Therefore, the measurement equipment, namely the measurement device, has to be calibrated initially.

This type of calibration is generally known in the state of the art. A reciprocal frequency-converting device may be used during the calibration. This approach is known from US 2015/0177300 A1, for instance, and is hereby incorporated by reference in its entirety.

In this approach, artifacts are identified and removed as long as the local oscillator is fixed in frequency during the calibration and measurement processes. Effectively, the phase of the local oscillator is a single fixed value that does not vary during the calibration or rather the measurement.

However, if the local oscillator is stepped in frequency during the measurement, the above-mentioned approach fails, as a shift in the phase of the local oscillator occurs at the junction of the device under test each time the local oscillator is stepped in frequency. This phase shift of the local oscillator may be caused by the method in which the local oscillator frequency is synthesized in the measurement equipment and/or the electrical length of the transmission line leading from the junction of the device under test to the measurement equipment, namely the local oscillator path.

In addition to the approach mentioned above, another approach is known in the state of the art that requires an external reconverting mixer to complete the measurement setup. The external reconverting mixer solves the problem of the stepping local oscillator, as the phase change in the local oscillator is shared between the device under test and the external reconverting mixer, effectively rationing the phase shift out of the measurement result.

However, the external reconverting mixer has to be customized for each device under test individually. Thus, it is not convenient to work with, as it adds additional complexity to the measurement.

As the second approach requires an external reconverting mixer customized to each device under test, there is still a need for a possibility to characterize a frequency-converting device in an easy and efficient manner while using a local oscillator that is stepped in frequency.

SUMMARY

Embodiments of the present disclosure provide a method of determining a relative phase change of a local oscillator signal at a junction of a frequency-converting device under test as the local oscillator signal is varied in frequency. In an embodiment, the method includes the steps of:

inputting an RF signal and the local oscillator signal into the frequency-converting device under test;

measuring an RF to IF group delay on the frequency-converting device under test at two or more different local oscillator frequencies, each local oscillator frequency being assigned to a corresponding RF frequency, creating local oscillator and RF frequency pairs, assembling the RF to IF group delays measured into a group delay array;

integrating the group delay values across the array, resulting in a calculated phase array comprising calculated phases;

measuring an RF to IF insertion phase on the frequency-converting device under test at the local oscillator and RF frequency pairs used for measuring the RF to IF group delays;

comparing the calculated phases with the measured phases; and subtracting the measured phases from the calculated phases at each of the local oscillator and RF frequency pairs, resulting in an array that corresponds to the relative phase change of the local oscillator signal at the junction of the frequency-converting device under test as the local oscillator signal is varied in frequency.

Several methods according to the present disclosure relate to identifying the effect of a swept local oscillator frequency so that this effect can be considered in an error correction model later applied.

Therefore, the RF to IF group delays of the device under test is measured at each local oscillator frequency setting, namely at each of the two or more different local oscillator frequencies. The RF to IF group delay relates to the transit time of a respective signal through the device under test. The RF to IF group delays can be determined by different techniques known in the art, namely by a network analyzer, for example a vector network analyzer (VNA).

Then, the respective group delays measured at each local oscillator frequency setting are stitched together (assembling step) in order to obtain the group delay array. In other words, the group delays measured are stitched together to a group delay trace.

Afterwards, the group delay array, namely the group delays stitched together, is integrated in order to create the calculated phase array having calculated phases at each local oscillator frequency setting. The created calculated phase array is also called phase response. This also corresponds to a trace, namely a phase trace.

Then, the calculated phases are compared with the measured phases at the same local oscillator and RF frequency pairs which were used for measuring the RF to IF group delays previously.

Thus, deviations between the calculated and the measured phases at the local oscillator frequency settings can be identified. Alternatively or additionally, integration settings to be used for integrating the group delay array can be determined in an appropriate manner, for instance a constant of integration.

The calculated phase array in some embodiments is used together with the measured phases in order to identify the impact of the stepping local oscillator frequency on the measurement result.

Once the impact of the stepping local oscillator frequency is identified, it can be effectively removed from the measurement result, as it is also taken into account in the error correction model that is used to capture the shift in the phase of the local oscillator from frequency point to frequency point during a swept local oscillator measurement. This error correction model is also called reciprocal mixer phase error model.

Put another way, an additional term is added to the known error correction model that is used to capture the phase shift of the local oscillator signal from frequency point to frequency point during a swept local oscillator measurement. The resulting array accounts for the amount of shift in the calibration results due to the phase shift of the local oscillator when it is stepped in frequency.

Generally, the calculated phases correspond to phase offset values such that the calculated phase array is an array of phase offset values, namely one phase offset value for each local oscillator frequency used. The phase trace may be used to calculate the local oscillator phase offsets, which are added to the error correction model.

In other words, some methods according to the present disclosure provide an additional local oscillator stepped mode enabling to handle the phase shift of the local oscillator. Accordingly, the measurement can be done even though the local oscillator is stepped in frequency during the measurement contrary to the approaches known in the state of the art.

In addition, no external reconverting mixer customized is necessary for the respective frequency-converting measurement. Hence, the frequency-converting device can be characterized easily and efficiently while using a local oscillator that is stepped in frequency.

Put another way, the advantage of some methods according to the present disclosure with respect to the approaches known in the state of the art concern the usage of stepped local oscillators for the respective measurements while simultaneously eliminating the need of an external reconverting mixer, which simplifies the overall measurement (setup).

Several methods according the present disclosure take the insertion delay of the local oscillator path between a calibration reference plane and the junction of the device under test into account. This local oscillator path only has an effect on the measurement if the local oscillator frequency is varied during the measurement. With a fixed local oscillator frequency, this local oscillator path does not matter, as it relates to an insertion phase offset that applies to all measurement points in a similar manner. However, the swept local oscillator frequency results in a changing local oscillator path insertion phase over frequency and, thus, different offset values for each measurement point (at a different frequency).

However, this effect can be compensated by using, for example, one or more methods mentioned above and by applying the result obtained from one of these methods in the error correction model, for instance a known reciprocal mixer phase error model.

According to an aspect, the frequency-converting device under test receives the RF signal and the local oscillator signal. The frequency-converting device under test processes the RF signal and the local oscillator signal. The frequency-converting device under test outputs an IF signal. The RF signal and the local oscillator signal relate to the input signals of the frequency-converting device that processed both input signals in order to output the intermediate frequency signal (IF signal) as an output signal.

Another aspect provides that each local oscillator and RF frequency pair is assigned to a frequency tuple comprising a local oscillator frequency, a corresponding RF frequency as well as an IF frequency associated therewith. Thus, each local oscillator frequency setting has a corresponding RF input frequency and IF output frequency associated with it, resulting in the respective frequency tuple.

The integration may result in a conversion of the group delay array into the calculated phase array plus a constant of integration. The integration of the group delay array provides the respective phase response together with a constant of integration. The constant of integration may be set or rather selected, for instance by an operator or rather user of the measurement system. Thus, the constant of integration can be used in the comparing step as a variable to be set, and in some embodiments for adapting the calculated phase array with respect to the measured phases. However, the constant of integration applies to all entries of the calculated phase array in a similar manner.

In some embodiments, the constant of integration is set, for instance by a customer or user (manually). In other words, the constant of integration may be selected or rather set in a desired manner.

Generally, the constant of integration is used to shift all entries of the calculated phase array, namely the correction array, by the respective value assigned to the constant of integration. This results in a calculated phase array being adapted. Thus, the respective array is also called adapted phase array.

The constant of integration may be set such that, for one of the local oscillator and RF frequency pairs, the measured phase and the calculated phase plus the constant of integration have the same phase result. The same phase result means that a relative phase shift of 0 degrees is obtained between the calculated phase and the measured phase for the local oscillator and RF frequency pair selected. Thus, the constant of integration is chosen such that no phase shift occurs for the selected local oscillator and RF frequency pair. This local oscillator and RF frequency pair selected corresponds to a reference point.

In the comparison step, the respective constant of integration required is determined in order to obtain the same phase result for the measured phase and the calculated phase plus the constant of integration for the local oscillator and RF frequency pair selected.

In other words, one entry in the calculated phase array is selected, for instance the first entry, the last entry, the middle entry or any randomly chosen entry of the calculated phase array. The selected entry relates to the reference point.

As mentioned above, the other local oscillator and RF frequency pairs, namely all other entries, are shifted by the constant of integration as well, resulting in the adapted phase array.

The respective shifting of the phases is done for the calculated phase array, also called correction array. Thus, the measured phases are not affected by the shifting.

The shifting of the entries of the calculated phase array results in a calculated phase array that is adapted by the respective value of the constant of integration set or rather selected. Thus, the calculated phase array that is adapted by the respective value of the constant of integration may be used for the step of subtracting the measured phase from the calculated phase at each of the local oscillator and RF frequency pairs.

Moreover, the constant of integration may be set to a constant value, for instance zero. Depending on the result of the comparison, the constant of integration is selected appropriately. The constant of integration is a constant value that applies to all local oscillator and RF frequency pairs.

Generally, the initially calculated phase array has a constant of integration with a value of zero.

In case of a constant of integration being different than zero, the adapted phase array corresponds to the initially calculated phase array plus the respective constant of integration.

According to another aspect, the RF to IF group delays are measured by techniques that remove an effect of a local oscillator path and the phase of the local oscillator signal. This ensures that the calculated phases derived from the measured group delays, namely by means of integration, are not affected by the local oscillator path and the phase of the local oscillator signal.

For instance, each RF to IF group delay is measured at least twice. Thus, at least two group delay measurements are performed for each frequency setting of the local oscillator. The number of group delay measurements relates to a trade off in measurement time versus accuracy of the delay measurement.

In some embodiments, the RF frequency is shifted up and/or down by a delta frequency while holding the local oscillator frequency constant. The group delay can be easily determined by using the respective measurements at the RF frequency minus the delta frequency and at the RF frequency plus the delta frequency.

For instance, the local oscillator frequency is shifted up and/or down by a delta frequency while holding the RF frequency constant. This has a similar effect as shifting the RF frequency. Thus, the group delay is determined by using the respective measurements at the local oscillator frequency minus the delta frequency and at the local oscillator frequency plus the delta frequency.

The value of the delta frequency can be optimized. The value needs to be large in order to cause a larger shift in the phase response for each of the measurement points, which minimizes the error due to phase noise and other variation. Further, the value needs to be small enough that the phase values do not wrap around, or exceed 360 degrees. The value also needs to be small enough to effectively identify the "local" value of the delay, and not miss small variations in the delay response by stepping over them with a large delta frequency.

For example, a phase slope is calculated at each local oscillator and RF frequency pair when calculating the respective group delays.

Generally, the forward and reverse phases are set equal at the respective frequency configuration, particularly prior to assembling the group delays measured. In other words, the scattering parameters related thereto are set equal, namely S21=S12.

The offset determined is applied to the forward and reverse phases such that reciprocity of the respective phases is maintained.

A further aspect provides that the calculated phases solely depend on an insertion phase of the frequency-converting device under test. It does not contain phase shifts due to the local oscillator path and/or the local oscillator signal itself. As mentioned above, this is ensured by using respective techniques for measuring the group delays that are converted by means of integration into phases. For instance, the group delay for each local oscillator frequency is measured while shifting the RF frequency by the delta frequency.

In some embodiments, the insertion phase relates to the insertion phase from an RF port to an IF port of the frequency-converting device under test. The RF to IF group delays are measured, which means that the transit time of a respective signal through the device under test from the RF port to the IF port is measured. Thus, the calculated phase array is a measure of the frequency-converting device under test, particularly its insertion phase.

The measured phases may depend on an insertion phase of the frequency-converting device under test, the local oscillator signal and the local oscillator path. In contrast to the calculated phases, the measured phases also depend on the local oscillator signal and the local oscillator path.

The constant of integration is determined in the comparison step in an appropriate manner. Thus, subtracting the calculated phases (adapted) and the measured phases from each other yields a resulting array that corresponds to the relative phase shift in the local oscillator signal at the junction of the frequency-converting device under test as the local oscillator signal is varied across the frequency. The relative phase shift in the local oscillator signal may comprise the influence of the local oscillator signal and the local oscillator path.

Another aspect provides that the relative phase change of the local oscillator signal at the junction is used to modify the local oscillator signal to have a specific phase relationship across the local oscillator and RF frequency pairs. The local oscillator signal is one of the input signals and, thus, the local oscillator signal influences the processing by the frequency-converting device under test. In fact, once the relative phase change of the local oscillator signal at the junction is identified, the relative phase change can be used to modify the synthesized local oscillator signal such that the actual phase of the local oscillator signal, as observed at the junction of the mixer, is a fixed value with respect to the RF signal that is also applied to the frequency-converting device under test.

In some embodiments, the specific phase relationship corresponds to a sloping phase line, a triangle wave, a Barker code or any other intended phase relationship over frequency. The Barker code, also called Barker sequence, is a finite sequence of values being −1 or +1. Thus, the shape of the respective phase-frequency relationship may be set appropriately.

Generally, the local oscillator signal varied in frequency relates to a measurement in which each measurement point utilizes a different local oscillator frequency.

Further, embodiments of the present disclosure provide a method of determining a relative phase change of an RF signal at a junction of a frequency-converting device under test as the RF signal is varied in frequency, with the following steps:

Inputting the RF signal and a local oscillator signal into the frequency-converting device under test;

Measuring a local oscillator to IF group delay on the frequency-converting device under test at two or more different RF frequencies, each RF frequency being assigned to a corresponding local oscillator frequency, creating RF and local oscillator frequency pairs, Assembling the local oscillator to IF group delays measured into a group delay array;

Integrating the group delay values across the array, resulting in a calculated phase array comprising calculated phases;

Measuring a local oscillator to IF phase on the frequency-converting device under test at the RF and local oscillator frequency pairs used for measuring the local oscillator to IF group delays;

Comparing the calculated phases with the measured phases; and Subtracting the measured phase from the calculated phase at each of the RF and local oscillator frequency pairs, resulting in an array that corresponds to the relative phase change of the RF signal at the junction of the frequency-converting device under test as the RF signal is varied in frequency.

Hence, the logic of the RF port and the LO port (as well as the respective signals) are reversed compared to the method of determining a relative phase change of a local oscillator signal.

Accordingly, a relative phase shift in the RF signal can be determined at the junction of the frequency-converting device under test, for instance a mixer, as the RF signal is varied in frequency.

The other features and aspects mentioned above with regard to the method of determining a relative phase change of a local oscillator signal apply in a similar manner to the method of determining a relative phase change of an RF signal while reversing the logic of the RF port and the LO port (as well as the respective signals) in an appropriate manner.

Generally, the methods provide a resulting array, also called calibration array, that represents the variation (at the junction of the mixer) of the insertion phase of the local oscillator signal or rather the RF signal, as the respective signal is stepped across its frequency.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
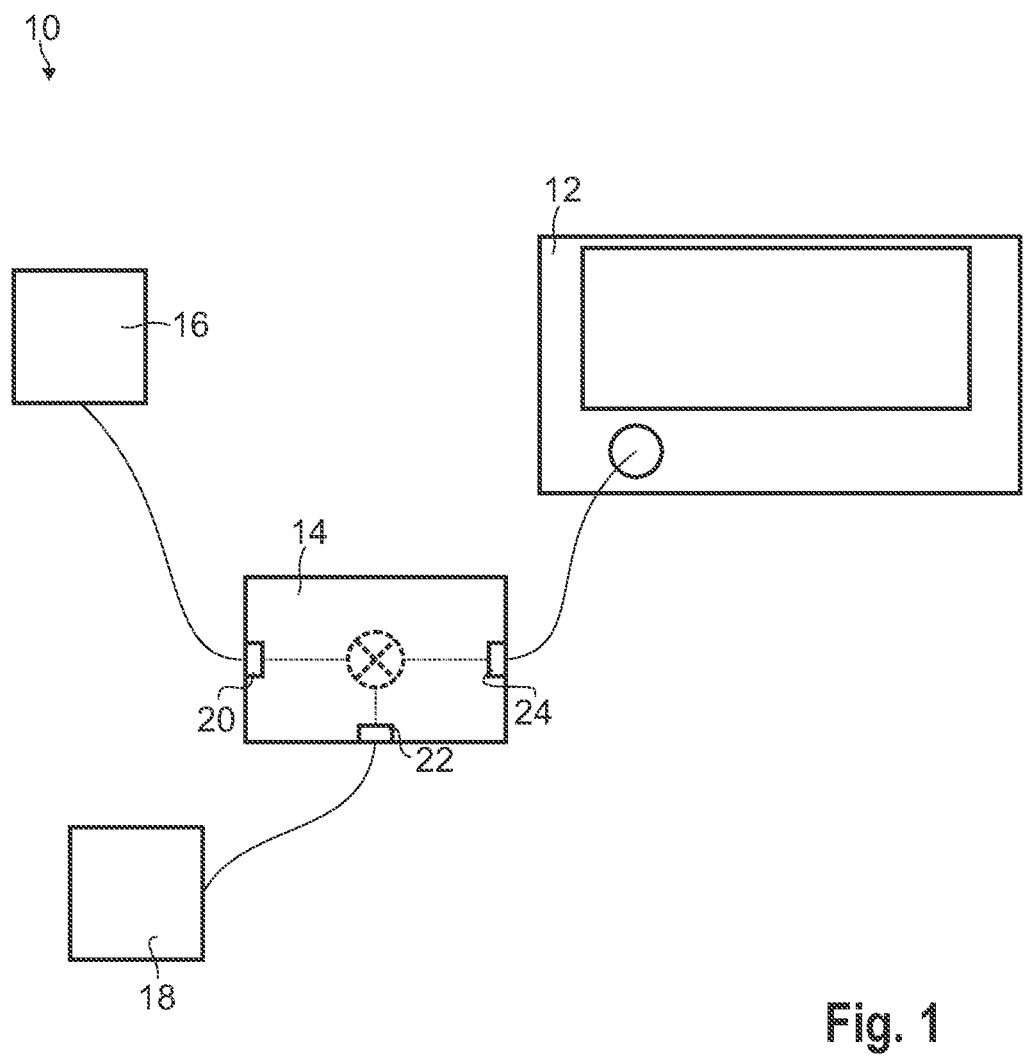
FIG. 1 schematically shows a measurement system used to perform a representative method according to the present disclosure.

FIG. 1 illustrates a measurement system 10 that comprises measurement equipment 12 and a frequency-converting device under test 14 connected with the measurement equipment 12. The measurement equipment 12 may comprise, for example, a network analyzer, such as a vector network analyzer (VNA). The frequency-converting device under test 14 may be a reciprocal one, for instance a mixer.

The measurement system 10 also comprises a radio frequency (RF) source 16 and a local oscillator 18 providing a radio frequency signal (RF signal) as well as a local oscillator signal (LO signal), respectively. The RF signal and the LO signal are inputted into the frequency-converting device under test 14 via an RF port 20 and a LO port 22, respectively. The local oscillator 18 is configured to provide a local oscillator signal with a varying frequency. In other words, the frequency of the local oscillator signal is varied.

The frequency-converting device under test 14 also includes an intermediate frequency (IF) port 24 configured as an output port. Thus, the frequency-converting device under test 14 processes the received RF signal and LO signal internally and outputs an intermediate frequency signal (IF signal).

In the shown embodiment, the RF source 16 and the local oscillator 18 are separately formed with respect to the measurement equipment 12, which may be connected with the RF source 16 and the local oscillator 18. However, the measurement equipment 12 may also comprise the RF source 16 and/or the local oscillator 18 in an integrated manner. In this embodiment, this arrangement means that the RF source 16 and/or the local oscillator 18 are housed within the same housing as the components of the measurement equipment 12.

Figure 2:
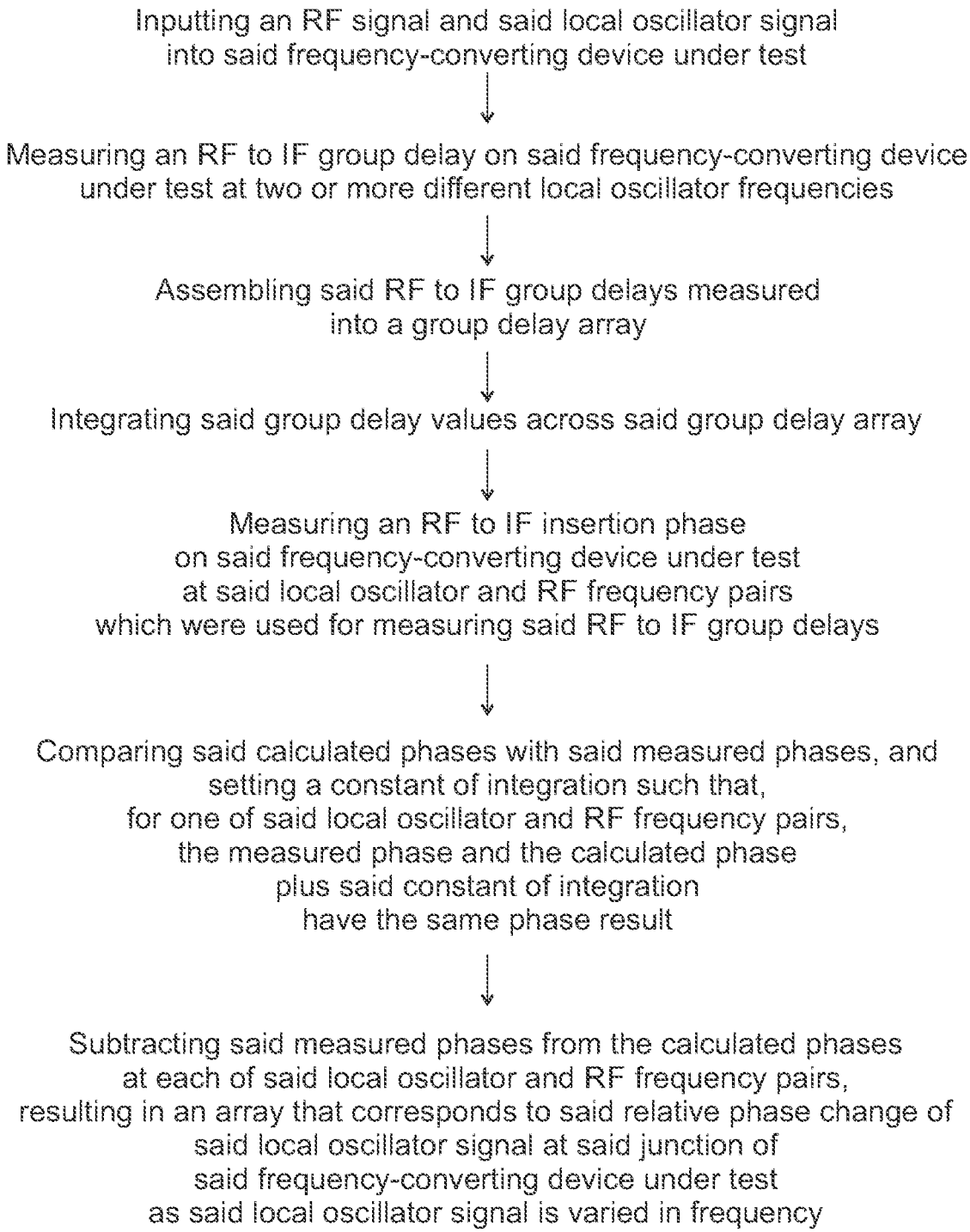
FIG. 2 shows a flow-chart illustrating a representative method of determining a relative phase change of a local oscillator signal according to the present disclosure.

In FIG. 2, a flow-chart is shown that illustrates a representative method of determining a relative phase change of a local oscillator signal at a junction of a frequency-converting device under test as the local oscillator signal is varied in frequency.

In a first step S1, the RF source 16 and the local oscillator 18 provides the RF signal and the LO signal, respectively, which are inputted into the frequency-converting device under test 14 via the respective ports 20, 22.

In a second step S2, the measurement equipment 12 connected with the frequency-converting device under test 14, for example the RF port 20 and the IF port 24, measures at least one RF to IF group delay on the frequency-converting device under test 14 for a certain local oscillator frequency.

For instance, the RF to IF group delay is measured at least twice for each local oscillator frequency. The respective RF frequency is shifted up and/or down by a delta frequency while holding the local oscillator frequency constant yielding three different measurements at the respective RF frequency minus the delta frequency, the respective RF frequency as well as the respective RF frequency plus the delta frequency. The measurement at the respective RF frequency minus the delta frequency as well as the measurement at the respective RF frequency plus the delta frequency are taken into account to calculate the group delay at the respective RF frequency. Accordingly, it may also be sufficient to perform the measurements at the respective RF frequency minus/plus the delta frequency, respectively.

Accordingly, the respective measurements are done with the RF at the calibration point, with the RF below the calibration point (minus delta frequency), and with the RF above the calibration point (plus delta frequency).

For example, these different measurements are used to create the error model (using the fixed local oscillator approach known in the art), wherein the error model is applied to the single point in the swept local oscillator error model.

These measurements are repeated in a similar manner for a next local oscillator frequency setting (local oscillator frequency). For example, several measurements are done for different local oscillator frequencies.

Accordingly, the RF to IF group delays are measured by techniques that remove an effect of the local oscillator path and the phase of the local oscillator signal.

In some embodiments, RF to IF group delays are measured at two or more different local oscillator frequencies when the local oscillator 18 is swept.

Each local oscillator frequency is assigned to a corresponding RF frequency such that local oscillator and RF frequency pairs are created for the respective local oscillator frequency used for the measurement. In some embodiments, frequency tuples are obtained, which each comprise a local oscillator frequency, a corresponding RF frequency as well as an IF frequency associated therewith.

Alternatively, the local oscillator frequency is shifted up/down by a delta frequency while holding the RF frequency constant. In other words, the logic of the local oscillator frequency and the RF frequency are reversed.

In a third step S3, the measured RF to IF group delays are assembled or rather stitched together in order to obtain a group delay array. This group delay array relates, for example, to a group delay trace.

In a fourth step S4, the group delay values of the group delay array are integrated across the group delay array, which results in a calculated phase array comprising calculated phases. The calculated phase array relates, for example, to a calculated phase trace.

In other words, the group delay values are converted into phase values by means of integration. Thus, the integration results in a conversion of the group delay array into the calculated phase array plus a constant of integration. The constant of integration may be set to a certain value, for instance by an operator or rather a user, as will be described below.

As the RF to IF group delays were measured by techniques that remove the effect of the local oscillator path and the phase of the local oscillator signal, the calculated phases versus local oscillator frequency relates to a relationship that solely depends on the frequency-converting device under test 14. For example, the calculated phase array obtained after the integration solely depends on an insertion phase of the frequency-converting device under test 14, namely the insertion phase from the RF port 20 to the IF port 24 of the frequency-converting device under test 14. In other words, the calculated phases of the calculated phase array do not contain phase shifts due to the local oscillator path of the frequency-converting device under test 14 or the local oscillator signal itself.

In a fifth step S5, which may take place at any time, an RF to IF insertion phase is measured on the frequency-converting device under test 14.

The RF to IF phases are measured at the local oscillator and RF frequency pairs that were also used for measuring the RF to IF group delays in step S2. Accordingly, the same local oscillator and RF frequency pairs are used so that the respective results can be compared with each other.

The measured phases depend on the insertion phase of the frequency-converting device under test 14, the local oscillator signal and the local oscillator path contrary to the calculated phases, as discussed above.

In a sixth step S6, the calculated phases are compared with the measured phases. In this sixth step S6, the constant of integration mentioned in step S4 is set such that the measured phases and the calculated phases plus the constant of integration have the same phase result for one of the several local oscillator and RF frequency pairs.

Accordingly, a certain value for the constant of integration is set so that one entry of the calculated phase array is selected that serves as reference. For the selected entry or rather the respective local oscillator and RF frequency pair, the same phase result is obtained for the measured phase and the calculated phase plus the constant of integration. This means that for this selected local oscillator and RF frequency pair, no phase shift occurs.

Accordingly, the constant of integration is set such that, for the selected local oscillator and RF frequency pair, the phase shift of the measured phase and the calculated phase has a value of zero degrees.

In a seventh step S7, the measured phases are subtracted from the calculated phase for each of the local oscillator and RF frequency pairs mentioned above.

This yields an array that corresponds to the relative phase change of the local oscillator signal at the junction of the frequency-converting device under test as the local oscillator signal is varied in frequency.

Accordingly, the phase shift may be set to zero for the one local oscillator and RF frequency pair selected.

For the other local oscillator and RF frequency pairs, the respective local oscillator phase offsets may be determined in the comparison step. The respective local oscillator phase offsets determined may be added to the error correction model mentioned above.

In general, the relative phase change of the local oscillator signal at the junction can be used to modify the local oscillator signal to have a specific phase relationship across the local oscillator and RF frequency pairs. The specific phase relationship corresponds to a sloping phase line, a triangle wave, a Barker code or any other intended phase relationship over frequency.

Figure 3:
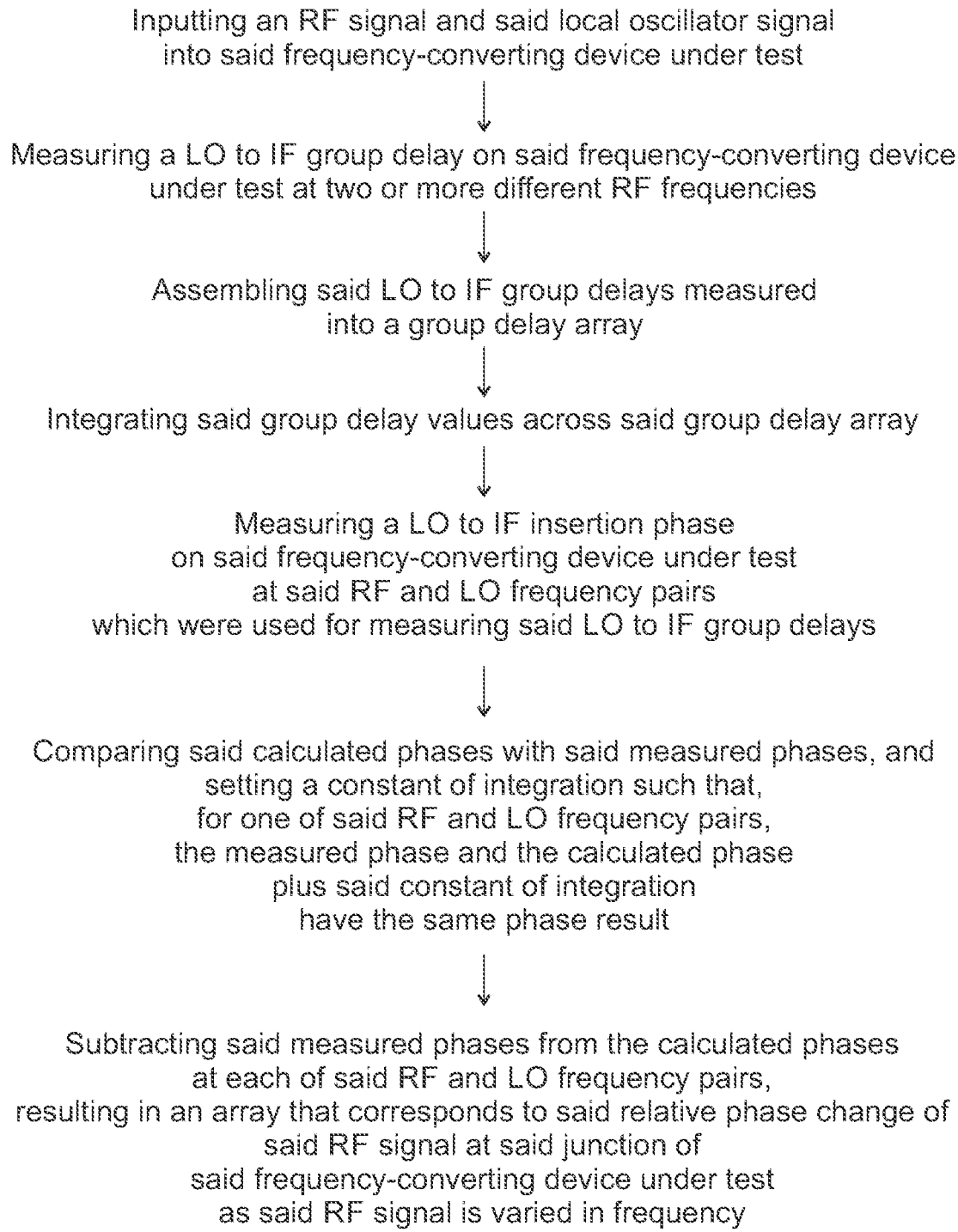
FIG. 3 shows a flow-chart illustrating a representative method of determining a relative phase change of a radio frequency signal according to the present disclosure.

Further, the logic of the RF and the local oscillator may be reversed resulting in a method of determining a relative phase change of an RF signal at a junction of a frequency-converting device under test as the RF signal is varied in frequency. A respective flow-chart illustrating such a method is shown in FIG. 3.

In some embodiments, the method includes the same steps applied as discussed above, but using a reverse logic with regard to the RF and the local oscillator.

Generally, the methods described ensure that the effect of a swept local oscillator frequency on the measurements can be identified, particularly quantified. Hence, the effect can be considered in the error correction model applied later such that the measurement equipment can be calibrated appropriately.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of determining a relative phase change of a local oscillator signal at a junction of a frequency-converting device under test as said local oscillator signal is varied in frequency, comprising:
    inputting an RF signal and said local oscillator signal into said frequency-converting device under test;
    measuring an RF to IF group delay on said frequency-converting device under test at two or more different local oscillator frequencies, each local oscillator frequency being assigned to a corresponding RF frequency, creating local oscillator and RF frequency pairs,
    assembling said RF to IF group delays measured into a group delay array;
    integrating said group delay values across said group delay array, resulting in a calculated phase array comprising calculated phases;
    measuring an RF to IF insertion phase on said frequency-converting device under test at said local oscillator and RF frequency pairs used for measuring said RF to IF group delays;
    comparing said calculated phases with said measured phases; and
    subtracting said measured phases from the calculated phases at each of said local oscillator and RF frequency pairs, resulting in an array that corresponds to said relative phase change of said local oscillator signal at said junction of said frequency-converting device under test as said local oscillator signal is varied in frequency.

2. The method according to claim 1, wherein said frequency-converting device under test receives said RF signal and said local oscillator signal, said frequency-converting device under test processing said RF signal and said local oscillator signal, said frequency-converting device under test outputting an IF signal.

3. The method according to claim 1, wherein each local oscillator and RF frequency pair is assigned to a frequency tuple comprising a local oscillator frequency, a corresponding RF frequency as well as an IF frequency associated therewith.

4. The method according to claim 1, wherein said integration results in a conversion of said group delay array into said calculated phase array plus a constant of integration.

5. The method according to claim 4, wherein said constant of integration is set.

6. The method according to claim 4, wherein said constant of integration is set such that, for one of said local oscillator and RF frequency pairs, the measured phase and the calculated phase plus said constant of integration have the same phase result.

7. The method according to claim 4, wherein said constant of integration is set to a constant value.

8. The method according to claim 1, wherein said RF to IF group delays are measured by techniques that remove an effect of a local oscillator path and the phase of said local oscillator signal.

9. The method according to claim 1, wherein each RF to IF group delay is measured at least twice.

10. The method according to claim 9, wherein said RF frequency is shifted up and/or down by a delta frequency while holding said local oscillator frequency constant.

11. The method according to claim 9, wherein said local oscillator frequency is shifted up and/or down by a delta frequency while holding said RF frequency constant.

12. The method according to claim 1, wherein said calculated phases solely depend on an insertion phase of said frequency-converting device under test.

13. The method according to claim 1, wherein said measured phases depend on an insertion phase of said frequency-converting device under test, said local oscillator signal and said local oscillator path.

14. The method according to claim 12, wherein said insertion phase relates to the insertion phase from an RF port to an IF port of said frequency-converting device under test.

15. The method according to claim 1, wherein said relative phase change of said local oscillator signal at said junction is used to modify said local oscillator signal to have a specific phase relationship across said local oscillator and RF frequency pairs.

16. The method according to claim 15, wherein said specific phase relationship corresponds to a sloping phase line, a triangle wave, a Barker code or any other intended phase relationship over frequency.

17. The method according to claim 1, wherein the logic of the RF and the local oscillator is reversed.

18. A method of determining a relative phase change of an RF signal at a junction of a frequency-converting device under test as said RF signal is varied in frequency, comprising:

inputting said RF signal and a local oscillator signal into said frequency-converting device under test;

measuring a local oscillator to IF group delay on said frequency-converting device under test at two or more different RF frequencies, each RF frequency being assigned to a corresponding local oscillator frequency, creating local oscillator and RF frequency pairs, assembling said local oscillator to IF group delays measured into a group delay array;

integrating said group delay values across said array, resulting in a calculated phase array comprising calculated phases;

measuring a local oscillator to IF insertion phase on said frequency-converting device under test at said local oscillator and RF frequency pairs used for measuring said local oscillator to IF group delays;

comparing said calculated phases with said measured phases; and subtracting said measured phases from the calculated phases at each of said local oscillator and RF frequency pairs, resulting in an array that corresponds to said relative phase change of said RF signal at said junction of said frequency-converting device under test as said RF signal is varied in frequency.

* * * * *